United States Patent
Jing et al.

(10) Patent No.: US 9,871,064 B1
(45) Date of Patent: Jan. 16, 2018

(54) METHOD FOR FORMING SHALLOW TRENCHES OF THE DUAL ACTIVE REGIONS

(71) Applicant: SHANGHAI HUALI MICROELECTRONICS CORPORATION, Shanghai (CN)

(72) Inventors: Quan Jing, Shanghai (CN); Jin Xu, Shanghai (CN); Minjie Chen, Shanghai (CN); Yu Ren, Shanghai (CN); Yukun Lv, Shanghai (CN); Jun Zhu, Shanghai (CN); Xusheng Zhang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/283,271

(22) Filed: Sep. 30, 2016

(30) Foreign Application Priority Data

Jul. 28, 2016 (CN) .......................... 2016 1 0604747

(51) Int. Cl.
| | | |
|---|---|---|
| *H01L 21/00* | (2006.01) | |
| *H01L 27/146* | (2006.01) | |
| *H01L 21/3213* | (2006.01) | |
| *H01L 21/04* | (2006.01) | |
| *H01L 21/027* | (2006.01) | |
| *H01L 21/311* | (2006.01) | |
| *H01L 21/762* | (2006.01) | |
| *H01L 21/31* | (2006.01) | |

(52) U.S. Cl.
CPC .... *H01L 27/1461* (2013.01); *H01L 27/14687* (2013.01); *H01L 21/0274* (2013.01); *H01L 21/0475* (2013.01); *H01L 21/31* (2013.01); *H01L 21/31116* (2013.01); *H01L 21/3213* (2013.01); *H01L 21/76229* (2013.01)

(58) Field of Classification Search
CPC ...................... H01L 27/1461; H01L 27/14687
USPC .......................................................... 438/81
See application file for complete search history.

(56) References Cited

U.S. PATENT DOCUMENTS

| | | | | |
|---|---|---|---|---|
| 6,218,084 B1 * | 4/2001 | Yang | ...................... | G03F 7/427 134/1.1 |
| 6,921,721 B2 * | 7/2005 | Kirkpatrick | ....... | H01L 21/02054 257/E21.228 |
| 7,521,333 B2 * | 4/2009 | Choi | ................. | H01L 21/76229 257/E21.54 |

* cited by examiner

*Primary Examiner* — Vu A Vu
(74) *Attorney, Agent, or Firm* — Tianchen LLC

(57) ABSTRACT

The invention disclosed a method for forming shallow trenches of the dual active regions. Firstly, forming an etch stop layer on a semiconductor substrate; secondly, using a first accurate photomask to expose and develop the semiconductor substrate, until the etch stop layer has been exposed on the top of the first shallow trench regions and the second shallow trench regions; thirdly, etching the etch stop layer entirely in the exposed regions; fourthly, using a second photomask to expose and develop the first shallow trench regions which require a deeper etch depth of the trench than that of the second shallow trench regions; fifthly, etching and forming preliminary entirely depth in the first shallow trench regions, and then removing the second photomask; at last, taking the etch stop layer as a mask, and simultaneously etching the first shallow trench regions and the second shallow trench regions to form the first hallow trenches and the second shallow trenches having different depths. The invention has realized a low-cost photomask application and an optimization of the etching process by optimizing the photomask design.

9 Claims, 6 Drawing Sheets

METHOD FOR FORMING SHALLOW TRENCHES OF THE DUAL ACTIVE REGIONS

CROSS-REFERENCE TO RELATED APPLICATION

This application claims the priority benefit of China patent application serial No. 201610604747.7, filed Jul. 28, 2016. The entire contents of the above-mentioned patent application are hereby incorporated by reference herein and made a part of the specifications.

FIELD OF THE INVENTION

The present invention relates to the field of semiconductor manufacturing technology, and particularly to a new method for forming shallow trenches of the dual active regions.

BACKGROUND OF THE INVENTION

CMOS image sensors are electrical solid-state imaging sensors, which are exhibiting more superiority in the aspects of system complexity and reliability, data output and exposure control, etc., than traditional CCD, due to their intrinsic high integration. Therefore, audio and video products based the CMOS image sensors will replace the CCD products to become the main trend of market in the future.

In the semiconductor manufacturing process, the CMOS image sensors proposes special requirements for structures of their shallow trenches. In addition to having active regions as the traditional CMOS, pixel regions are also required to manufacture to meet the needs of image sensor. Therefore, in the shallow trench etching process, two different etch depths are required to form two kinds of active regions structure.

Referring to FIGS. 1-5, which are schematic views illustrating a shallow trench forming process at the dual active regions of the prior art. As shown in FIGS. 1-5, the solutions of the prior art are that adopting two separate photoresist exposure processes to meet the shallow trench etching's needs of different depths at the active regions I and the pixel regions II of the CMOS image sensors respectively. Detailed steps are as follows:

1) using a first accurate photomask to accomplish the exposure of active regions I of the CMOS image sensors, as shown in FIG. 1;

2) accomplishing a shallow trench etching process with required depth for active regions I of the CMOS image sensors in the etching process chamber, as shown in FIG. 2;

3) adopting subsequent a stripping process and a cleaning process to remove polymer residues generated by the reaction;

4) using a second accurate photomask to accomplish the exposure of the pixel regions II, as shown in FIG. 3;

5) accomplishing a shallow trench etching process with required depth for the pixel regions II in the etching process chamber, as shown in FIG. 4;

6) adopting subsequent a stripping process and a cleaning process to remove the polymer residues generated by the reaction. Finally, the shallow trench structure with different depths at the dual active regions is formed, as shown in FIG. 5.

However, above solutions of the prior art exist some problems, which are:

1) the two accurate photomasks are needed which increases the cost;

2) the shallow trench depths at the active regions of the CMOS image sensors after the first etching process will bring great difficulties for the refilling ability and flatness of the BARC layer 1 (bottom anti-reflective coating) of the second accurate photomask.

BRIEF SUMMARY OF THE DISCLOSURE

To overcome the problems as mentioned above, it is an object of the present invention to provide a new method for forming shallow trenches of dual active regions to accomplish a low-cost photomask application and an optimization of the etching process by optimizing the photomask design.

To achieve above object, technical solutions of the present invention are as follows:

A method for forming shallow trenches of the dual active regions, comprising the steps of Step S01: providing a semiconductor substrate having first shallow trench regions and second shallow trench regions, on which forming an etch stop layer;

Step S02: using a first accurate photomask to expose and develop the semiconductor substrate, until the etch stop layer has been exposed on the top of the first shallow trench regions and the second shallow trench regions;

Step S03: etching the etch stop layer entirely in the exposed regions;

Step S04: using a second photomask to expose and develop the first shallow trench regions;

Step S05: etching and forming the first shallow trenches with a preliminary depth in the first shallow trench regions, and then removing the second photomask;

Step S06: taking the etch stop layer as a mask, and simultaneously etching the first shallow trench regions and the second shallow trench regions to form the first shallow trenches and the second shallow trenches having different depths, wherein the depth of the first shallow trenches are deeper than that of the second shallow trenches.

Preferably, the etch stop layer is a hard mask layer in the Step S01.

Preferably, the second shallow trench regions are completely covered by the second photomask in the Step S04.

Preferably, in the Step S03, a stripping process and a cleaning process are employed subsequently to remove polymer residues generated by the etching reaction.

Preferably, the stripping process in the Step S03 is a dry stripping process.

Preferably, the dry stripping process is an oxidation stripping process or a plasma stripping process.

Preferably, in the Step S05, an in-situ stripping process is utilized to remove the polymer residues generated by the etching reaction.

Preferably, the process condition of the in-situ stripping process in the Step S05 is that the oxygen gas flow is 100-300 sccm, the power is 500-1500 W, the pressure is 2-10 mT, and the temperature is 40-60° C.

Preferably, in the Step S06, subsequent cleaning processes are utilized to remove polymer residues generated by the etching reaction.

Preferably, the process condition of the cleaning process in the Step S06 is that a DHF and an APM are adopted for cleaning in turn.

Concluded from the above technical solutions, in order to meet the needs of two different etching depths of shallow trench in different regions for certain special chip design, firstly, the present invention uses a first accurate photomask to etch the etch stop layer, secondly, adopting the low-cost second photomask to accomplish the subsequent etching processes, wherein the in-situ stripping process is utilized to complete the integral etching of shallow trench regions with two different depths. The present invention has realized a low-cost photomask application and an optimization of the etching process by optimizing the photomask design, and has provided a new solution for the shallow trench process of the dual active regions.

DETAILED DESCRIPTION OF THE EMBODIMENTS

Figure 1:
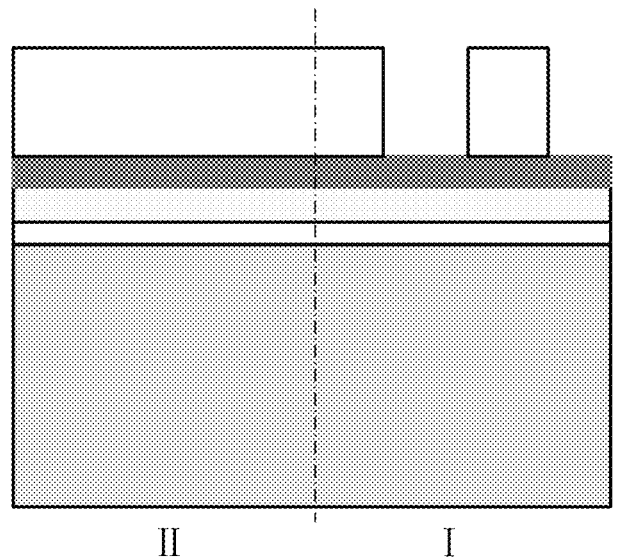
FIGS. 1-5 are schematic views illustrating the shallow trench forming process of the dual active regions of the prior art.
Figure 2:
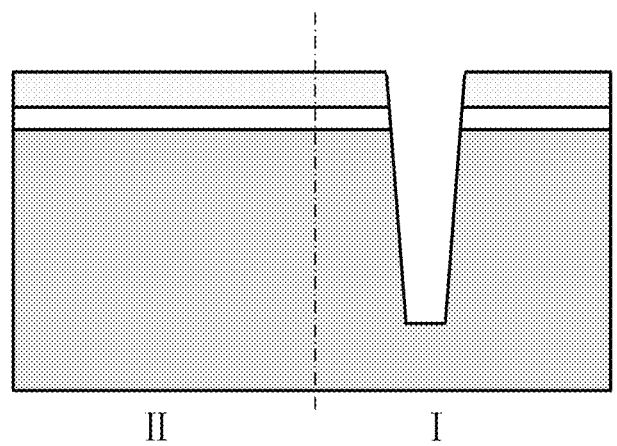
Figure 3:
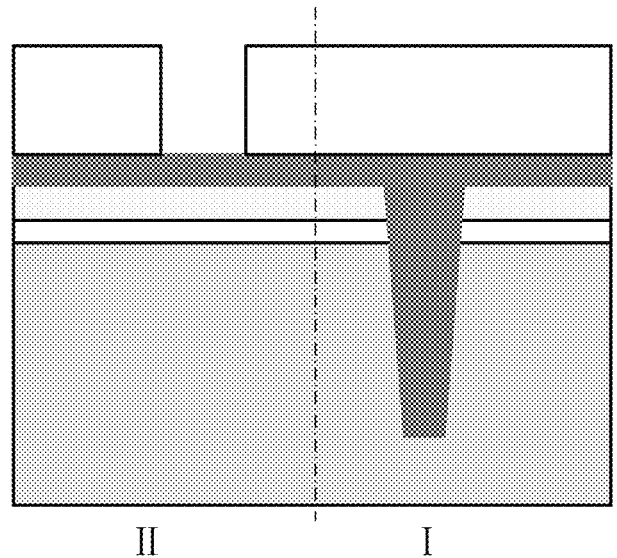
Figure 4:
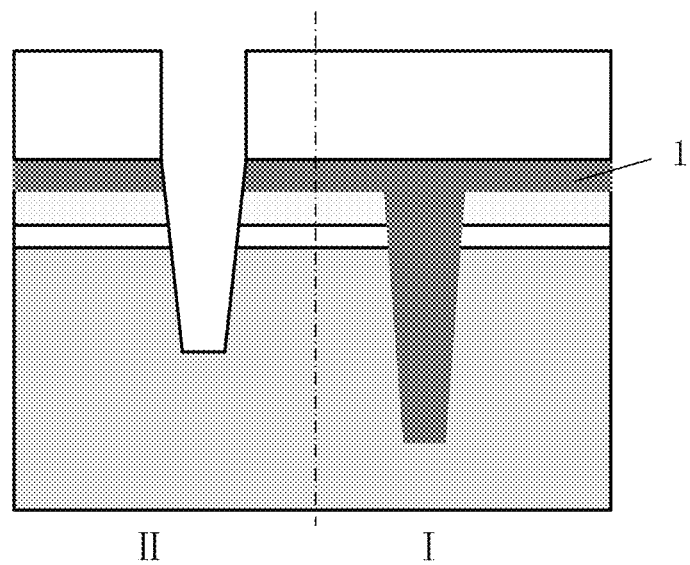
Figure 5:
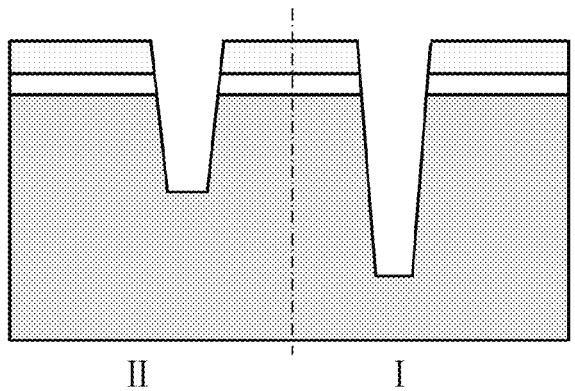

The present invention will be described in further details hereinafter by referring to the accompanying drawings, so as to provide a better understanding of the present invention.

It should be noted that, in the following specific embodiments, when these embodiments of the present invention are described in detail, in order to clearly illustrate the structure of the present invention to facilitate explanation, the accompanying drawings are not necessarily drawn to scale, some features in the drawings may have been fragmentary enlarged, deformed or simplified. Therefore, it would be avoided to understand this as a limitation to the present invention.

Figure 6:
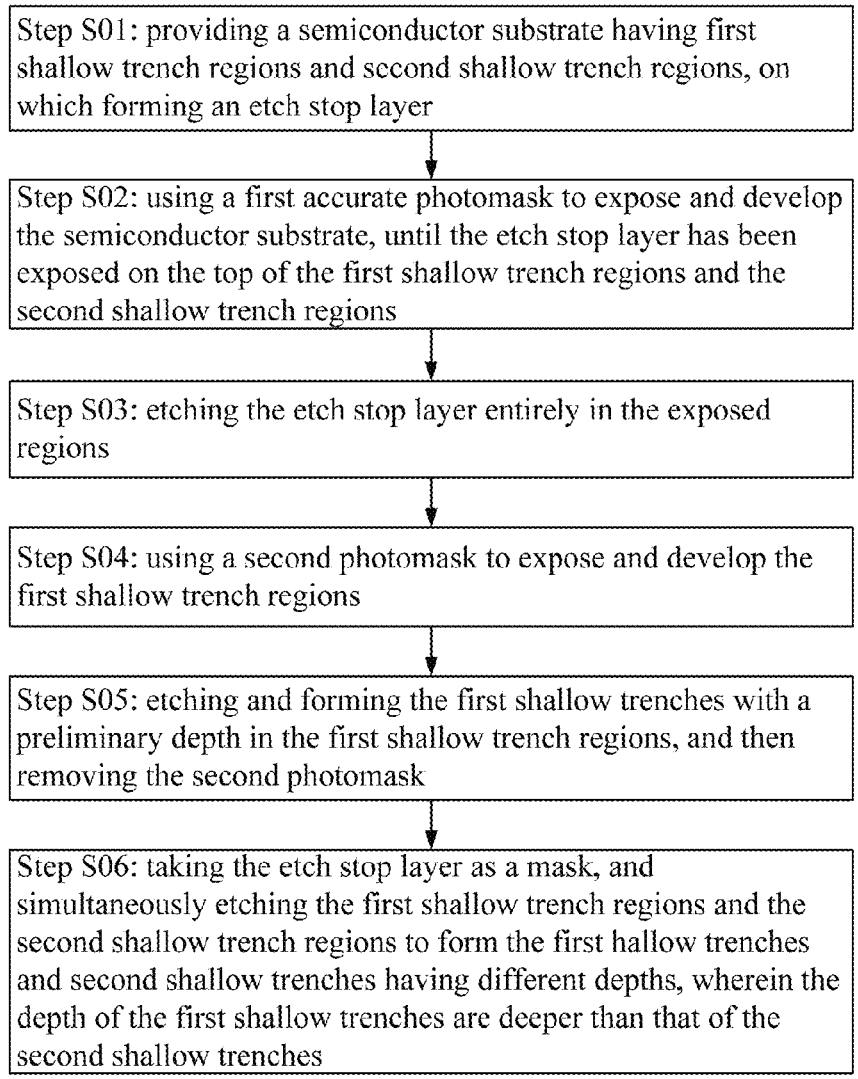
FIG. 6 is a flow sheet illustrating the shallow trench forming method of the dual active regions of the present invention.

Referring to FIG. 6, which is a flow sheet illustrating the shallow trench forming method of the dual active regions of the present invention. As shown in FIG. 6, which discloses a method for forming shallow trenches of the dual active regions, comprising the steps of Executing Step S01: providing a semiconductor substrate having first shallow trench regions and second shallow trench regions, on which forming an etch stop layer.

Figure 7:
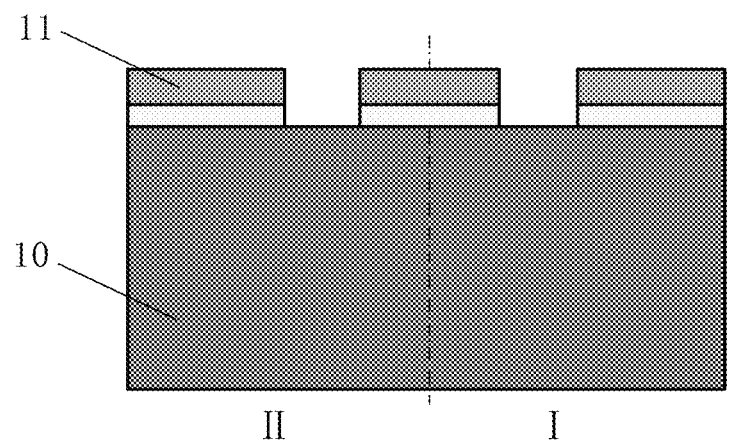
FIGS. 7-10 are schematic views illustrating the shallow trench forming process of the dual active regions according to a preferred embodiment of the present invention.

Referring to FIG. 7, taking the semiconductor substrate of silicon wafer used to manufacture the CMOS image sensors as an example, active regions I and pixel regions II of the CMOS image sensors adjacent to each other are disposed at the region of the chips of the CMOS image sensors on the semiconductor substrate 10. Firstly, a hard mask layer 11 such as silicon nitride is deposited on the semiconductor substrate 10 through a conventional CMOS process, which is used as an etch stop layer 11.

Executing Step S02: using a first accurate photomask to expose and develop a first photoresist covering the semiconductor substrate, until the etch stop layer has been exposed on the top of the first shallow trench regions and the second shallow trench regions.

Specifically, referring to FIG. 7 again, taking an accurate photomask as the first photomask, the first photoresist covering active regions I (the first shallow trench regions) and the pixel regions II (the second shallow trench regions) of the CMOS image sensors requiring different etch depths of the shallow trenches are simultaneously exposed and developed, until the hard mask layer 11 has been exposed out on the top of the first shallow trench regions and the second shallow trench regions.

Executing Step S03: etching the etch stop layer entirely in the exposed regions.

Specifically, referring to FIG. 7 again, then, the etching of the exposed hard mask layer 11 in the exposed regions is proceeded in the etching chamber through a conventional etching process, until the semiconductor substrate 10 has been exposed out on the top of the shallow trenches in the first shallow trench regions and the shallow trenches in the second shallow trench regions.

After the above etching process, a stripping process and a cleaning process are employed subsequently to remove polymer residues generated by the etching reaction. Wherein, the stripping process is a dry stripping process (ASH), such as the conventional oxidation stripping process or plasma stripping process. Of course, other proper processes could also be utilized to remove polymer residues generated by the etching reaction.

Executing Step S04: using a second photomask to expose and develop a second photoresist to expose the first shallow trench regions.

Figure 8:
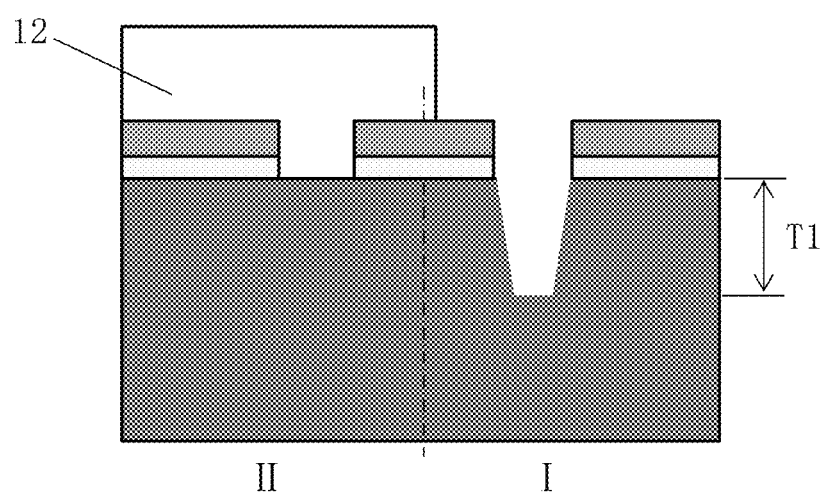

Specifically, referring to FIG. 8, then, the second photomask with a low-cost, is utilized to expose and develop the second photoresist 12. The patterned second photoresist 12 covers completely the pixel regions II (the second shallow trench regions) which are avoided to be exposed, so that only the active regions I (the first shallow trench regions) of the CMOS image sensors are exposed.

Executing Step S05: etching and forming the first shallow trenches with a preliminary depth in the first shallow trench regions, and then removing the second photomask.

Specifically, referring to FIG. 8 again, then, taking the hard mask layer 11 of silicon nitride in the active regions I of the CMOS image sensors as a mask, the exposed regions of the CMOS image sensors are firstly etched to a T1 depth which is the preliminary entirely depth of etching for the CMOS image sensors.

Figure 9:
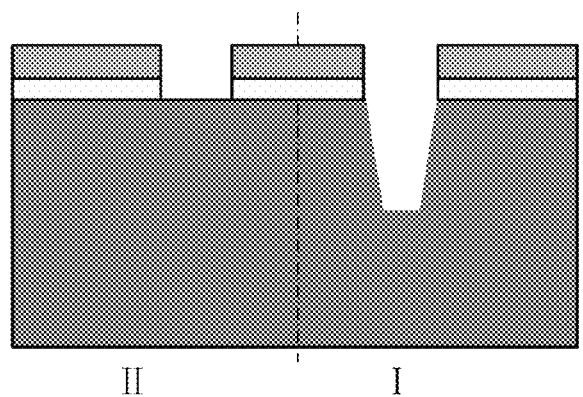

Specifically, referring now to FIG. 9, after the above etching process, the second photomask needs to be removed. An in-situ strip process can be utilized to remove the photoresist residues generated by the second photomask and the polymer residues generated by the etching reaction in the etching chamber mentioned above. Wherein, the process condition of the in-situ stripping process is that the oxygen gas flow is 100-300 sccm, the power is 500-1500 W, the pressure is 2-10 mT, and the temperature is 40-60° C.

Executing Step S06: taking the etch stop layer as a mask, and simultaneously etching the first shallow trench regions and the second shallow trench regions to form the first shallow trenches and the second shallow trenches having different depths, wherein the depth of the first shallow trenches are deeper than that of the second shallow trenches.

Figure 10:
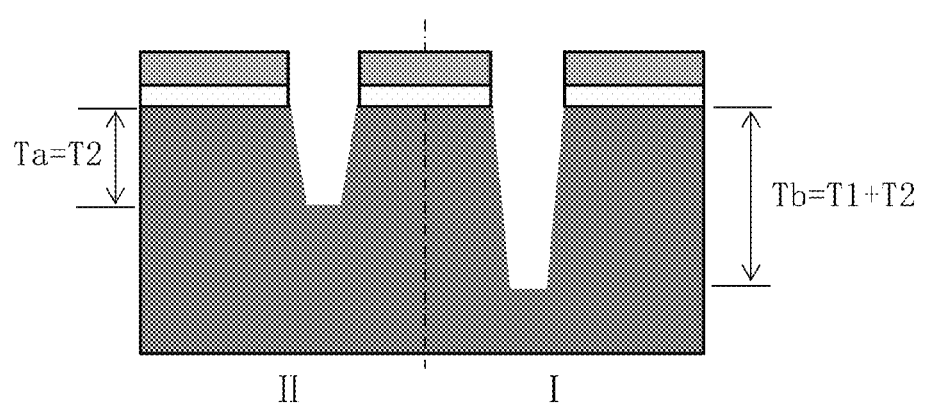

Specifically, referring now to FIG. 10, finally, taking the hard mask layer 11 of silicon nitride in the active regions I and the pixel regions II of the CMOS image sensors as a mask, the first shallow trench regions and the second shallow trench regions are simultaneously etched a T2 depth in the etching chamber mentioned above, again. In other words, if the shallow trench depths of the pixel regions II and the active regions I are set as Ta and Tb respectively, the shallow trench depth Ta of the pixel regions II is equal to T2, and the shallow trench depth Tb of the active regions I is equal to the sum of T1 and T2.

The subsequent cleaning process is then utilized to remove polymer residues generated by the etching reaction, in which a DHF (hydrofluoric acid dilution) is firstly adopted for cleaning, and then an APM (solution mixed by $NH_4OH$, $H_2O_2$, and $H_2O$, also called SC-1 cleaning solution) is adopted subsequently for cleaning.

Applicability of the present invention can be further disclosed by comparison with the prior art in FIGS. 11-15.

Figure 11:
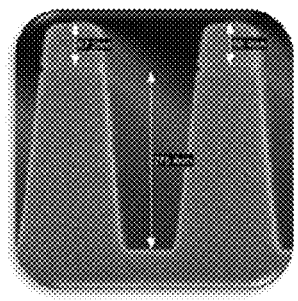
FIG. 11 is a referential photomicrograph illustrating the etching morphology of the shallow trenches.
Figure 12:
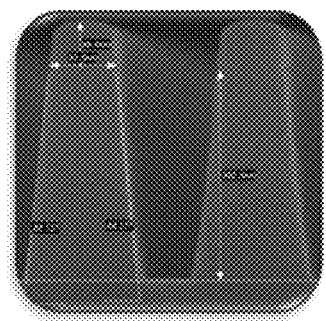
FIG. 12 is a photomicrograph illustrating the etching morphology of the shallow trenches according to the method of the present invention.

As shown in FIGS. 11-12, compared with the prior art, the present invention can reach the same requirement for the structure of the shallow trench (text and arrows in FIGS. 11-12 can be ignored), and can also reach the same requirement for the depth uniformity.

Figure 13:
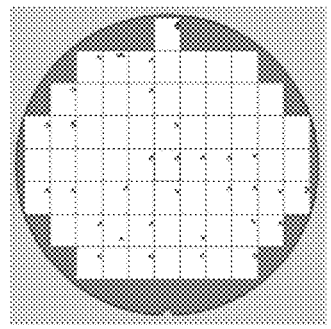
FIG. 13 is a schematic view illustrating referential defects performance after the etching of the shallow trenches.
Figure 14:
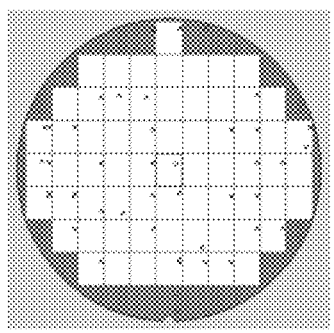
FIG. 14 is a schematic view illustrating referential defects performance after the etching of the shallow trenches according to the method of the present invention.

As shown in FIGS. 13-14, compared with the prior art, the present invention can reach the same requirement for the defects performance.

In summary, the present invention completes the integral etching of the shallow trench regions with two different depths by two etching processes, which employs a first accurate photomask to expose and develop the etch stop layer and a low-cost second photomask to accomplish the subsequent etching process respectively, according to the requirements of two different etching depths of the shallow trench at the different regions for certain special chip design. Wherein the in-situ stripping process is employed in the second etching process. The present invention has realized a low-cost photomask application and an optimization of etching process by optimizing the photomask design, so that a new solution has been provided to satisfy the requirements for the shallow trench process at the dual active regions.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method for forming shallow trenches of the dual active regions, comprising the steps of
    Step S01: providing a semiconductor substrate having first shallow trench regions and second shallow trench regions, on which forming an etch stop layer;
    Step S02: using a first accurate photomask to expose and develop a first photoresist covering the semiconductor substrate, until the etch stop layer has been exposed on the top of the first shallow trench regions and the second shallow trench regions;
    Step S03: etching the etch stop layer entirely in the exposed regions;
    Step S04: using a second low-cost photomask to expose and develop a second photoresist to expose the first shallow trench regions;
    Step S05: etching and forming the first shallow trenches with a preliminary depth in the first shallow trench regions, and then removing the second low-cost photomask, wherein an in-situ stripping process is utilized to remove polymer residues generated by the etching reaction;
    Step S06: taking the etch stop layer as a mask, and simultaneously etching the first shallow trench regions and the second shallow trench regions to form the first shallow trenches and second shallow trenches having different depths, wherein the depth of the first shallow trenches are deeper than that of the second shallow trenches.

2. The method of claim 1, wherein the etch stop layer is a hard mask layer in the Step S01.

3. The method of claim 1, wherein the second shallow trench regions are completely covered by the second low-cost photomask in the Step S04.

4. The method of claim 1, wherein in the Step S03, a stripping process and a cleaning process are employed subsequently to remove polymer residues generated by the etching reaction.

5. The method of claim 4, wherein the stripping process in the Step S03 is a dry stripping process.

6. The method of claim 5, wherein the dry stripping process is an oxidation stripping process or a plasma stripping process.

7. The method of claim 1, wherein the process condition of the in-situ stripping process in the Step S05 is that the oxygen the gas flow is 100-300 sccm, the power is 500-1500 W, the pressure is 2-10 mT, and the temperature is 40-60° C.

8. The method of claim 1, wherein in the Step S06, the subsequent cleaning process is utilized to remove polymer residues generated by the etching reaction.

9. The method of claim 8, wherein the process condition of the cleaning process in the Step S06 is that a DHF and an APM are adopted for cleaning in turn.

\* \* \* \* \*